US012692621B2

(12) United States Patent
Stettner et al.

(10) Patent No.: US 12,692,621 B2
(45) Date of Patent: Jul. 28, 2026

(54) METHOD FOR DEPOSITING AN EPITAXIAL LAYER ON A SUBSTRATE WAFER MADE OF SEMICONDUCTOR MATERIAL IN A DEPOSITION DEVICE

(71) Applicant: SILTRONIC AG, Munich (DE)

(72) Inventors: Thomas Stettner, Waging am See (DE); Walter Edmaier, Wittibreut (DE)

(73) Assignee: SILTRONIC AG, Munich (DE)

( * ) Notice: Subject to any disclaimer, the term of this patent is extended or adjusted under 35 U.S.C. 154(b) by 254 days.

(21) Appl. No.: 18/563,407

(22) PCT Filed: May 11, 2022

(86) PCT No.: PCT/EP2022/062771
§ 371 (c)(1),
(2) Date: Nov. 22, 2023

(87) PCT Pub. No.: WO2022/253533
PCT Pub. Date: Dec. 8, 2022

(65) Prior Publication Data
US 2024/0218558 A1 Jul. 4, 2024

(30) Foreign Application Priority Data

Jun. 1, 2021 (EP) ..................................... 21177025

(51) Int. Cl.
*C30B 25/12* (2006.01)
*C30B 25/16* (2006.01)

(52) U.S. Cl.
CPC .............. *C30B 25/12* (2013.01); *C30B 25/16* (2013.01)

(58) Field of Classification Search
CPC ......... C30B 25/00; C30B 25/02; C30B 25/12; C30B 25/14; C30B 25/16; C30B 25/165;
(Continued)

(56) References Cited

U.S. PATENT DOCUMENTS

| 2001/0008782 A1 | 7/2001 | Matsuyama et al. |
| 2009/0314205 A1 | 12/2009 | Patalay et al. |

(Continued)

FOREIGN PATENT DOCUMENTS

| DE | 112018001223 T5 | 11/2019 |
| EP | 3905311 A1 | 11/2021 |

(Continued)

*Primary Examiner* — Kenneth A Bratland, Jr.
(74) *Attorney, Agent, or Firm* — LEYDIG, VOIT & MAYER, LTD.

(57) ABSTRACT

A method deposits an epitaxial layer on a semiconductor substrate. The method includes: placing the substrate on a susceptor, which is surrounded, separated by a gap, from a preheat ring and is held by a supporting shaft; determining an excentricity between an axis perpendicularly through the center of the preheat ring and through the center of the susceptor; passing deposition gas over the substrate wafer along a flow direction pointing from a gas inlet to outlet; passing purge gas along a lower side of the preheat ring and of the susceptor; and rotating the supporting shaft about an axis of rotation with a frequency, by displacing the supporting shaft from a starting position to an end position and back to the starting position with the frequency of the rotating of the supporting shaft, the displacement path from the starting position to the end position being dependent on the excentricity.

6 Claims, 4 Drawing Sheets

(58) Field of Classification Search
    CPC ............ C23C 16/455; C23C 16/45587; C23C
                    16/458; C23C 16/4584; C23C 16/4585
    USPC ........ 117/84–86, 88, 98, 102, 107, 928, 935
    See application file for complete search history.

(56)                    References Cited

U.S. PATENT DOCUMENTS

| | | | |
|---|---|---|---|
| 2012/0263875 A1 | 10/2012 | Brenninger et al. | |
| 2016/0010239 A1* | 1/2016 | Tong ................... | C23C 16/4584 |
| | | | 392/416 |
| 2020/0354853 A1 | 11/2020 | Komori | |
| 2023/0178398 A1 | 6/2023 | Stettner et al. | |

FOREIGN PATENT DOCUMENTS

| | | | |
|---|---|---|---|
| JP | 2001274158 A | | 10/2001 |
| JP | 2007242889 A | | 9/2007 |
| JP | 2012004148 A | | 1/2012 |
| JP | 2012227527 A | | 11/2012 |
| JP | 2016213242 A | * | 12/2016 |
| JP | 2017069414 A | | 4/2017 |
| JP | 2019114711 A | | 7/2019 |

* cited by examiner

METHOD FOR DEPOSITING AN EPITAXIAL LAYER ON A SUBSTRATE WAFER MADE OF SEMICONDUCTOR MATERIAL IN A DEPOSITION DEVICE

CROSS REFERENCE TO RELATED APPLICATIONS

This application is a U.S. National Phase application under 35 U.S.C. § 371 of International Application No. PCT/EP2022/062771, filed on May 11, 2022, and claims benefit to European Patent Application No. EP 21177025.0, filed on Jun. 1, 2021. The International Application was published in German on Dec. 8, 2022 as WO 2022/253533 A1 under PCT Article 21(2).

FIELD

The present disclosure concerns a method for depositing an epitaxial layer on a substrate wafer of semiconductor material in a deposition apparatus.

BACKGROUND

The deposition of an epitaxial layer on a substrate wafer of semiconductor material is typically accomplished by CVD (chemical vapor deposition) in a deposition apparatus, which is able to accommodate a substrate wafer. During deposition of the epitaxial layer, the substrate wafer is located on a susceptor, which is held and rotated by a supporting shaft, and a deposition gas is passed over a free upper surface of the substrate wafer, in other words its front side, and at the same time a purge gas is passed along a lower side of a preheat ring and a lower side of the susceptor. The preheat ring is arranged around the susceptor, separated by a gap. Upper and lower domes define a reaction chamber within, which the epitaxial layer is deposited on the substrate wafer. Radiant heat from lamp arrays is irradiated through one or both domes in order to provide a required deposition temperature.

A deposition apparatus having these features is described in US 2016 0 010 239 A1, for example.

Semiconductor wafers having an epitaxial layer (epitaxial wafer) are required for particularly demanding applications in the electronics industry. The requirements in relation, for example, to the uniformity of thickness of the epitaxial layer deposited, accordingly, are particularly challenging.

DE 11 2018 001 223 T5 discloses how differences in thickness in the epitaxial layer may be diminished by means of a preheat ring, the shape of its inner periphery deviating from a circular shape, if the cause of the differences in thickness is a barely avoidable noncentric position of the susceptor during the deposition of the epitaxial layer. The noncentric position is manifested in an excentricity between an axis perpendicularly through the center of the preheat ring and an axis perpendicularly through the center of the substrate wafer.

JP 2016 213 242 A2 tackles the same problem with an adaptation of the conditions under which the epitaxial layer grows. The adaptation is made as a function of the excentricity, which is determined by means of a camera system.

The inventors have recognized that a drawback of these solutions is that the shape of the preheat ring represents a static system which does not allow a ready response to changing excentricities. The adaptation of growth conditions is a problem since it necessitates intervention in the flow mechanics of a complex system which reacts sensitively in relation to, in particular, the distribution of dopants.

The inventors have, therefore, recognized that it is desirable to provide a solution, which is easy to implement and which does not have such drawbacks.

SUMMARY

In an embodiment, the present disclosure provides a method that deposits an epitaxial layer on a substrate wafer of semiconductor material in a deposition apparatus. The method includes: placing the substrate wafer on a susceptor of the deposition apparatus, which is surrounded, separated by a gap, from a preheat ring and is held by a supporting shaft; determining an excentricity between an axis perpendicularly through the center of the preheat ring and an axis perpendicularly through the center of the susceptor; passing deposition gas over the substrate wafer along a flow direction pointing from a gas inlet to a gas outlet; passing purge gas along a lower side of the preheat ring and a lower side of the susceptor; and rotating the supporting shaft about an axis of rotation with a frequency, which includes displacing the supporting shaft from a starting position in which the axis of rotation is arranged along the axis perpendicularly through the center of the preheat ring to an end position and back to the starting position with the frequency of the rotating of the supporting shaft, the displacement path from the starting position to the end position being dependent on the excentricity.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
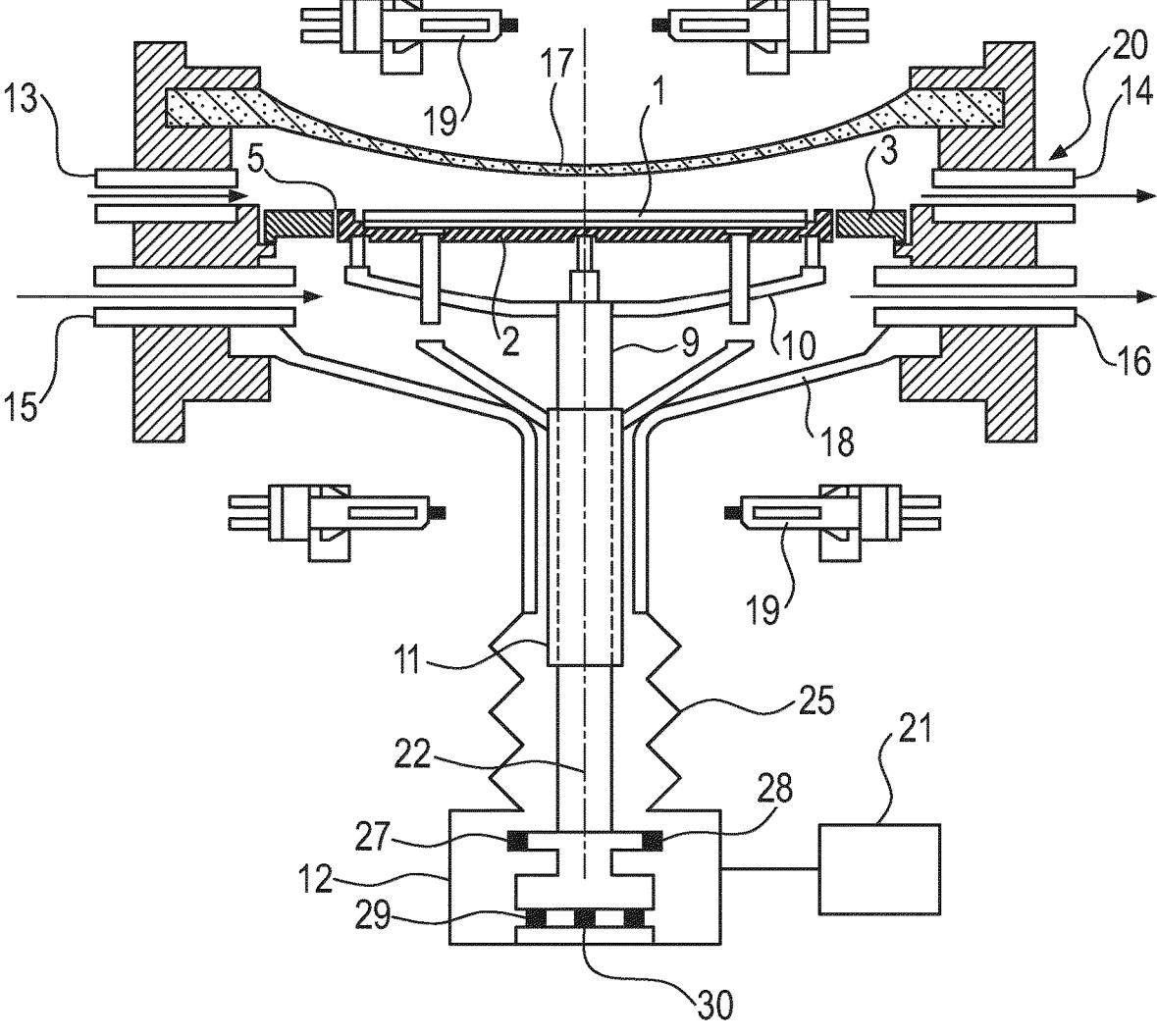
FIG. 1 shows an apparatus, represented in section, which is suitable for implementing the method of the present disclosure.

The present disclosure provides a method for depositing an epitaxial layer on a substrate wafer of semiconductor material in a deposition apparatus, comprising the placing of the substrate wafer on a susceptor of the deposition apparatus, which is surrounded, separated by a gap, from a preheat ring and is held by a supporting shaft;

the determining of an excentricity between an axis perpendicularly through the center of the preheat ring and an axis perpendicularly through the center of the susceptor;

the passing of deposition gas over the substrate wafer along a flow direction pointing from a gas inlet to a gas outlet;

the passing of purge gas along a lower side of a preheat ring and a lower side of the susceptor;

the rotating of the supporting shaft about an axis of rotation with a frequency;

which comprises the displacing of the supporting shaft from a starting position in which its axis of rotation is arranged along the axis perpendicularly through the center of the preheat ring to an end position and back to the starting position with the frequency of the rotating of the supporting shaft, the displacement path from the starting position to the end position being dependent on the excentricity.

The method may also be carried out in the hot state of the deposition chamber, at deposition temperature, for example, as there is no need to open the deposition chamber.

The excentricity is determined preferably by means of a camera system which, at one position at least, ascertains the change in the width of the gap between the inner edge of the preheat ring and the outer edge of the susceptor and on that basis calculates the excentricity. For a given rotational velocity of the susceptor, for example, it is possible to measure the rotational angle for which the greatest width of the gap since the start of one rotation is observed, with the start of one rotation defining a home signal of the deposition apparatus.

The susceptor is located with receiving faces on holding faces of arms of the supporting shaft. The excentricity is a result in particular of manufacturing tolerances exercised firstly by the holding faces on the arms of the supporting shaft and secondly by the receiving faces on the susceptor.

In accordance with the magnitude of the excentricity, the gap between the inner edge of the preheat ring and the outer edge of the susceptor is wider at one position of the periphery of the susceptor than at the other positions. Because of the wider gap, more purge gas enters the reaction chamber over the substrate wafer, where it dilutes the deposition gas more strongly. This effect is responsible for a more uneven distribution of the layer thickness of the epitaxial layer deposited on the substrate wafer.

In accordance with the present disclosure, the supporting shaft of the susceptor is displaced with the frequency of the rotating of the supporting shaft from a starting position, in which it is arranged along the axis perpendicularly through the center of the preheat ring, to an end position and back to the starting position, the displacement path from the starting position to the end position being dependent on the excentricity between the axis perpendicularly through the center of the preheat ring and the axis perpendicularly through the center of the susceptor.

The supporting shaft may be displaced using, for example, a drive as described in US 2016 0 010 239 A1. The supporting shaft is preferably displaced piezoelectrically by means of at least one actuator.

The susceptor is rotated preferably at 30 r min$^{-1}$ to 60 r min$^{-1}$, and the supporting shaft is displaced correspondingly with a periodic time of 1 s to 2 s.

The substrate wafer consists of semiconductor material, preferably of monocrystalline silicon, as does the epitaxial layer deposited on the front side of the substrate wafer. The diameter of the substrate wafer is preferably at least 200 mm, more preferably at least 300 mm.

The deposition gas comprises a compound containing the semiconductor material, as for example silane or a chlorosilane, as for example trichlorosilane; the purge gas preferably contains hydrogen.

According to a first configuration of the present disclosure, the displacement path from the starting position to the end position is described by a vector whose magnitude is the magnitude of the excentricity and whose direction is opposite to the direction of the excentricity. Magnitude and direction of the displacing of the supporting shaft are therefore guided by the excentricity between the axis perpendicularly through the center of the preheat ring and the axis perpendicularly through the center of the susceptor. With the frequency of the rotational movement of the supporting shaft, the supporting shaft is displaced from a starting position to an end position and back to the starting position. In the starting position, the supporting shaft of the susceptor is arranged along the axis perpendicularly through the center of the preheat ring. This axis is typically also the axis perpendicularly through the center of the deposition apparatus.

The displacing of the supporting shaft and of the susceptor it holds alleviates the imbalance in the rotational movement of the susceptor resulting from the excentricity. On a mean time basis, the substrate wafer lying on the susceptor is more centric to the preheat ring, and the width of the gap between the preheat ring and the susceptor is therefore more uniform on a mean time basis. This affects the thickness of the epitaxial layer deposited on the substrate wafer, the distribution thereof becoming more uniform.

According to a second configuration of the present disclosure, a wedge character of the substrate wafer is determined and is included in the factors taken into account for the displacing of the supporting shaft of the susceptor.

A substrate wafer is wedge-shaped if its thickness is subject to linear increase or linear decrease when the cross section of the substrate wafer is viewed along its diameter. The wedge character may be quantified for example by the ratio between greatest and smallest cross-sectional thickness.

The inventors have found that the wedge character decreases with the deposition of the epitaxial layer if the supporting shaft of the susceptor is displaced back and forth during deposition from a starting position to an end position with the frequency of the rotation of the supporting shaft of the susceptor along the flow direction of the deposition gas. In the starting position the supporting shaft of the susceptor is arranged along the axis perpendicularly through the center of the preheat ring. The magnitude of the displacement path from the starting position to the end position is guided by the extent of the wedge character of the substrate wafer. The correlation of displacement path magnitude which is necessary, in the presence of a certain wedge character of the substrate wafer, in order largely to eliminate the wedge nature resulting from the deposition of the epitaxial layer must be determined experimentally beforehand. The magnitude and direction of this displacement path may therefore be described by a further vector which is dependent on the wedge character of the substrate wafer.

In the second configuration of the present disclosure, the wedge character of the substrate wafer and the excentricity between the axis perpendicularly through the center of the preheat ring and the axis perpendicularly through the center of the susceptor are taken into account.

Correspondingly, during the deposition of the epitaxial layer the supporting shaft of the susceptor is displaced from the starting position to the end position and back to the starting position with the frequency of the rotating of the supporting shaft in accordance with the stipulation of a resultant vector. In the starting position the supporting shaft of the susceptor is arranged along the axis perpendicularly through the center of the preheat ring. The resultant vector corresponds to the vector sum of the further vector, describing the displacement path dependent on the wedge character of the substrate wafer, and the vector describing the displacement path which depends on the excentricity between the axis perpendicularly through the center of the preheat ring and the axis perpendicularly through the center of the susceptor.

The present disclosure is presented further below with reference to drawings. It is assumed hereinafter that the substrate wafer lies centrically on the susceptor and the excentricity is due to a noncentric position of the susceptor on the carrying arms of the supporting shaft of the susceptor.

FIG. 1 shows in a sectional representation, an apparatus for depositing an epitaxial layer on a substrate wafer of semiconductor material, suitable for implementing the method of the present disclosure. The reaction chamber of this deposition apparatus 20 is bounded above by an upper dome 17 and below by a lower dome 18. Arranged in the center of the reaction chamber is a supporting shaft 9, from which carrying arms 10 branch off at an upper end. The carrying arms 10 support a susceptor 2 on which a substrate wafer 1 is located during the deposition of an epitaxial layer. In the embodiment shown, in the course of the loading of the deposition apparatus 20, the substrate wafer 1 is to be placed on a lifting shaft 11 and placed on the susceptor 2 by lowering of the lifting shaft 11. Arranged between the side wall of the deposition apparatus and the susceptor 2 is a preheat ring 3. The deposition gas is passed over a front side of the substrate wafer 1, pointing to the upper dome 17, from a gas inlet 13 to a gas outlet 14, this inlet and outlet being arranged on one side wall of the deposition apparatus. Also provided, furthermore, is a corresponding further gas inlet 15 and further gas outlet 16 for purge gas, which is passed through the reaction chamber under the preheat ring 3 and under the susceptor 2. Arrows indicate the flow direction of the gas flows. Depending on the width of a gap 5 between the preheat ring 3 and the susceptor 2, a part of the purge gas enters into the flow of the deposition gas and dilutes the deposition gas. The reaction chamber is heated from the outside by lamp arrays 19 which irradiate radiation energy through the upper and lower domes 17 and 18. The lower dome 18 of the deposition apparatus 20 is joined to the basis 12 by a bellows 25 in order to enable the movement of the supporting shaft 9 and in order to seal off the interior created by the bellows with respect to inflowing ambient atmosphere.

The apparatus comprises a control device 21 which is configured for periodic displacement of the supporting shaft 9. For the displacement of the supporting shaft 9 in the horizontal there are actuators 27 (for displacement in x-direction) and 28 (for displacement in y-direction). There may also, optionally, be further actuators 29 and 30 provided for tilting the supporting shaft 9 out of the viewing plane of FIG. 1.

The apparatus further comprises a camera system 7 with image processing 8 (FIG. 2) in order to determine an excentricity between the axis 22 perpendicularly through the center of the preheat ring 3 and an axis 26 perpendicularly through the center of the susceptor 2. The camera system 7 comprises a camera for observing an image detail 6 during the rotating of the susceptor 2 by means of the supporting shaft 9. The image detail 6 captures a radially extending region which preferably includes a portion of the outer periphery of the substrate wafer 1, a portion of the outer periphery of the susceptor 2, and a portion of the inner periphery of the preheat ring 3, and hence also a portion of the gap 5 between the susceptor 2 and the preheat ring 3. The substrate wafer 1 lies in a pocket of the susceptor 2 on a placement area 4, and so the rear side 23 of the substrate wafer 1 is at a distance from the base 24 of the susceptor 2. The information contained in the image detail 6 is evaluated by means of the image processing 8.

Figure 2:
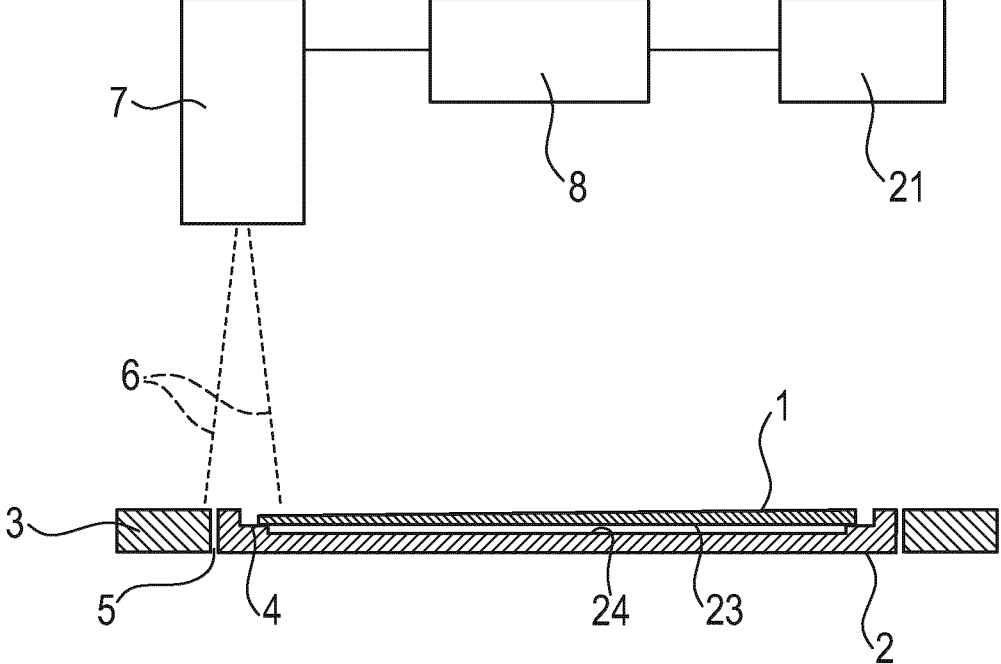
FIG. 2 shows further details of the apparatus.

The substrate wafer 1 illustrated in FIG. 2 has a wedge cross section. Its thickness increases linearly from a thinner edge to a thicker edge.

Figure 3:
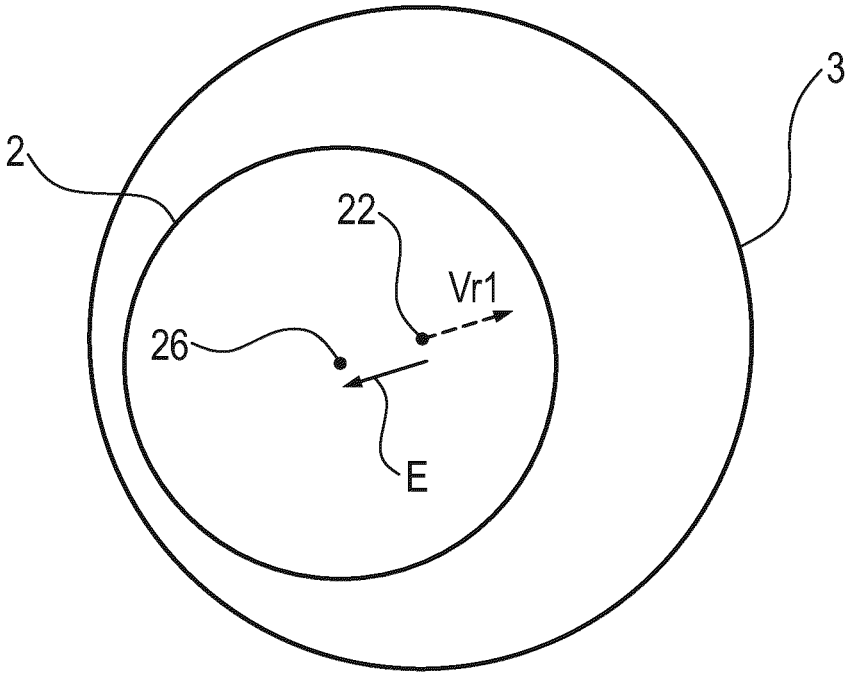
FIG. 3 and FIG. 4 show in a plan view the relative position of susceptor and preheat ring in the case of an existing excentricity between the axis perpendicularly through the center of the preheat ring and an axis perpendicularly through the center of the susceptor, and the displacing of the supporting shaft in accordance with the first and second configurations of the present disclosure.

FIG. 3 shows in plan view the relative position of the susceptor 2 and of the inner edge of the preheat ring 3 in the event of an excentricity between the axis 22 perpendicularly through the center of the preheat ring 3 and the axis 26 perpendicularly through the center of the susceptor 2. The rotational axis of the supporting shaft 9 is arranged in this starting position along the axis 22 perpendicularly through the center of the preheat ring 3. The magnitude and direction of the excentricity are described by the vector E. Where the substrate wafer 1 lies centrically on the susceptor 2, the axis 26 perpendicularly through the center of the susceptor and the axis perpendicularly through the center of the substrate wafer have the same position. According to the first configuration of the present disclosure, the supporting shaft 9, during the deposition of an epitaxial layer on the substrate wafer 1, is rotated with a frequency and displaced during each rotation from the starting position to an end position and back to the starting position. The magnitude and direction of the displacement are described by the vector Vr1, its magnitude being the magnitude of the vector E and its direction being opposite to that of the vector E. In the starting position, the rotational axis of the supporting shaft 9 is oriented along the axis 22 perpendicularly through the center of the preheat ring 3, and in the end position it is displaced to the tip of the vector Vr1.

Figure 4:
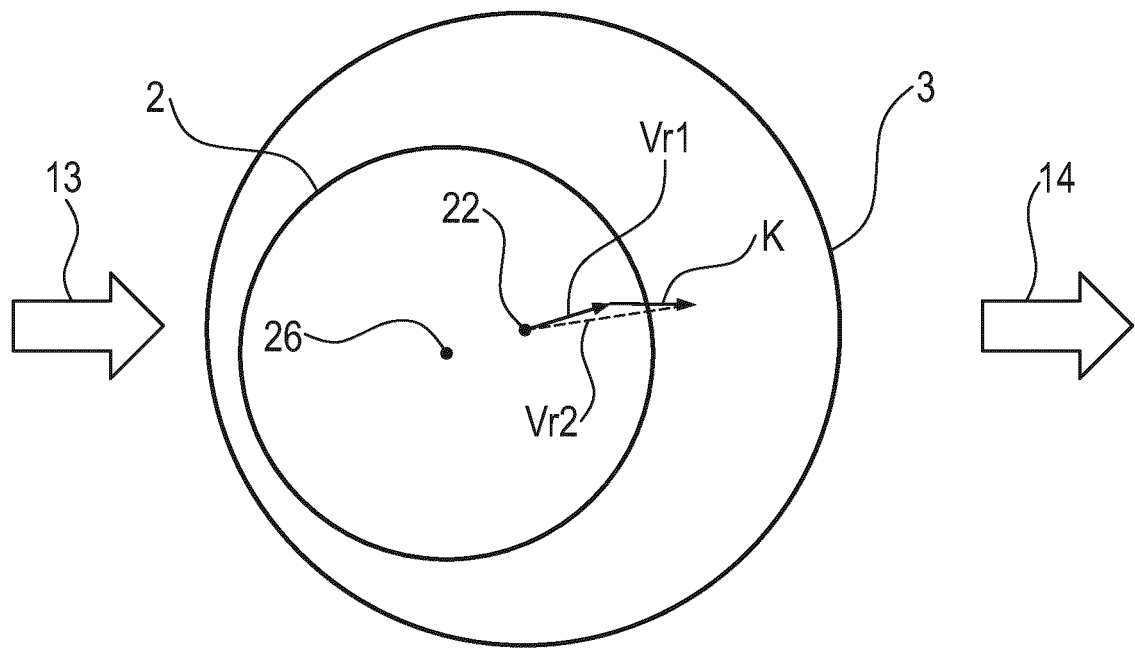

The second configuration of the present disclosure also takes into account the wedge character of the substrate wafer when the supporting shaft of the susceptor is displaced. FIG. 4 is a representation like that of FIG. 3 and illustrates the second configuration. According to the second configuration of the present disclosure, the supporting shaft 9 of the susceptor 2, during the deposition of an epitaxial layer on the substrate wafer 1, is rotated with a frequency and during each rotation is displaced from the starting position to an end position and back to the starting position. The magnitude and direction of the displacement path from the starting position to the end position are described by the resultant vector Vr2. This vector corresponds to the sum of the vectors Vr1 and K, where the vector K has a direction from the deposition gas inlet 13 to the gas outlet 14, in other words having the flow direction of the deposition gas, and has a magnitude which depends on the wedge nature of the substrate wafer 1. In the starting position, the rotational axis of the supporting shaft 9 is oriented along the axis 22 perpendicularly through the center of the preheat ring 3, and in the end position it is displaced to the tip of the resultant vector Vr2.

The lengths of the vectors represented in FIG. 3 and FIG. 4 are drawn in an exaggerated way for illustration. The respective displacement path in fact is typically 100-1000 μm.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SYMBOLS USED 1 substrate wafer
2 susceptor
3 preheat ring
4 deposition face
5 gap
6 image detail
7 camera system
8 image processing
9 supporting shaft
10 carrying arms
11 lifting shaft
12 basis
13 gas inlet
14 gas outlet
15 further gas inlet
16 further gas outlet
17 upper dome
18 lower dome
19 lamp arrays
20 deposition apparatus
21 control device
22 axis perpendicularly through the center of the preheat ring
23 rear side
24 bottom
25 bellows
26 axis perpendicularly through the center of the susceptor
27 actuator
28 actuator
29 actuator
30 actuator

What is claimed:

1. A method for depositing an epitaxial layer on a substrate wafer of semiconductor material in a deposition apparatus, the method comprising:

placing the substrate wafer on a susceptor of the deposition apparatus, the susceptor being surrounded, separated by a gap, from a preheat ring, and the susceptor being held by a supporting shaft having a supporting shaft axis, which is the axis of rotation of the supporting shaft;

determining an offset between a preheat ring axis and a susceptor axis, the preheat ring axis being perpendicularly through the center of the preheat ring, and the susceptor axis being perpendicularly through the center of the susceptor;

determining a displacement path by: determining a starting position as being where the supporting shaft axis is arranged along the preheat ring axis; and determining an end position based on the starting position and the offset;

passing deposition gas over the substrate wafer along a flow direction pointing from a gas inlet to a gas outlet;

passing purge gas along a lower side of the preheat ring and a lower side of the susceptor;

rotating, with a rotation frequency, the supporting shaft about the supporting shaft axis; and during each rotation of the supporting shaft, displacing the supporting shaft from the starting position to the end position and back to the starting position at a frequency matching the rotation frequency.

2. The method as claimed in claim 1, wherein the displacement path from the starting position to the end position is described by a vector whose magnitude is the magnitude of the offset and whose direction is opposite to the direction of the offset.

3. The method as claimed in claim 2, wherein the displacement path from the starting position to the end position is described by a resultant vector of a vector sum with the vector and a further vector as summands, the magnitude of the further vector being proportional to a ratio of a greatest and smallest cross-sectional thickness of the substrate wafer and the direction of the further vector being the same as the flow direction of the deposition gas.

4. The method as claimed in claim 1, wherein the supporting shaft is displaced by at least one actuator.

5. The method as claimed in claim 1, wherein the offset is determined as an offset vector defining an offset magnitude and an offset direction, wherein the method further comprises determining a displacement vector based on the offset vector such that the displacement vector has a displacement magnitude that is the magnitude of the offset magnitude and has a displacement direction that is opposite to the offset direction, and wherein the determining of the end position based on the starting position and the offset comprises determining the end position as a shift from the starting position according to the displacement vector.

6. The method as claimed in claim 1, wherein the offset is determined as an offset vector defining an offset magnitude and an offset direction, wherein the method further comprises:

determining a displacement vector based on the offset vector such that the displacement vector has a displacement magnitude that is the magnitude of the offset magnitude and has a displacement direction that is opposite to the offset direction;

determining a wedge characteristic of the substrate wafer as a ratio between a greatest and smallest cross-sectional thickness of the substrate wafer; and determining a further vector as having a direction as the flow direction and having a magnitude determined based on the wedge characteristic of the substrate wafer, and wherein the determining of the end position based on the starting position and the offset comprises determining the end position as a shift from the starting position according to a sum of the displacement vector and the further vector.

\* \* \* \* \*